(12) United States Patent
Nakao

(10) Patent No.: US 8,698,547 B2
(45) Date of Patent: Apr. 15, 2014

(54) CONTROL CIRCUIT AND ELECTRONIC DEVICE

(71) Applicant: Fujitsu Limited, Kawasaki (JP)

(72) Inventor: Hiroshi Nakao, Yamato (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/624,122

(22) Filed: Sep. 21, 2012

(65) Prior Publication Data

US 2013/0127518 A1 May 23, 2013

(30) Foreign Application Priority Data

Nov. 18, 2011 (JP) ................................. 2011-253321

(51) Int. Cl.
*H03K 17/687* (2006.01)
(52) U.S. Cl.
USPC ............ 327/434; 327/427; 327/374; 327/430
(58) Field of Classification Search
USPC ........................................................ 327/434
See application file for complete search history.

(56) References Cited

U.S. PATENT DOCUMENTS

| | | | |
|---|---|---|---|
| 5,932,827 A * | 8/1999 | Osborne et al. | 84/726 |
| 2003/0179035 A1* | 9/2003 | Braun et al. | 327/430 |
| 2008/0174184 A1* | 7/2008 | Arpilliere et al. | 307/125 |
| 2008/0197717 A1* | 8/2008 | Lorenzo et al. | 307/139 |
| 2010/0025730 A1* | 2/2010 | Heikman et al. | 257/194 |
| 2010/0283515 A1* | 11/2010 | Kelley et al. | 327/109 |
| 2011/0102052 A1* | 5/2011 | Billingsley et al. | 327/365 |

FOREIGN PATENT DOCUMENTS

| | | |
|---|---|---|
| JP | 53-48426 | 5/1978 |
| JP | 2007-159364 | 6/2007 |
| JP | 2008-182884 | 8/2008 |

* cited by examiner

*Primary Examiner* — Long Nguyen
*Assistant Examiner* — Patrick Chen
(74) *Attorney, Agent, or Firm* — Staas & Halsey LLP

(57) ABSTRACT

A control circuit includes: a first switching element having a source, a gate, and a drain; a battery configured to supply a voltage to the gate through a second switching element; a PWM signal generator circuit configured to supply a PWM signal to the gate through a third switching element; and a gate control circuit configured to, under a power-off condition, turn on the second switching element to supply the voltage of the battery to the gate and turns off the third switching element, and configured to under a power-on condition, turn on the third switching element to supply the PWM signal voltage to the gate and turns off the second switching element.

7 Claims, 6 Drawing Sheets

A —○— BEFORE BUILD-UP OF ELECTRIC CHARGE
B —●— AFTER BUILD-UP OF ELECTRIC CHARGE
C —◇— AFTER LEAVING FOR 30 DAYS

US 8,698,547 B2

CONTROL CIRCUIT AND ELECTRONIC DEVICE

CROSS-REFERENCE TO RELATED APPLICATION

This application is based upon and claims the benefit of priority of the prior Japanese Patent Application No. 2011-253321, filed on Nov. 18, 2011, the entire contents of which are incorporated herein by reference.

FIELD

The embodiments discussed herein relate to a control circuit and an electronic device.

BACKGROUND

In recent years, saving in energy resources in various fields has received attention and has caused a ripple effect also on the field of power supply, for example. Specifically, higher efficiency in a switching power supply, for example, has been sought.

The switching power supply converts an input direct voltage into a desired direct voltage by using a DC to DC (Direct Current to Direct Current) converter and thereby outputs the resultant voltage as a regulated power supply voltage. With a decrease in voltage and an increase in power consumption in a semiconductor element such as a CPU (central processing unit) for use in a computer, a switching power supply capable of achieving both low voltage and large-current output has come into use also as a power supply unit.

For further improvement in output efficiency of the power supply unit, power consumed by a switching element (i.e. a switching transistor) for use, for example, may be reduced. For a reduction in power loss, it is therefore desirable to use a switching element having low on-state resistance and a high switching rate. There has been developed a switching power supply transistor using a compound semiconductor material rather than silicon, which satisfies both these resistance and rate characteristics.

The followings are reference documents.
[Document 1] Japanese Laid-open Patent Publication No. 53-048426,
[Document 2] Japanese Laid-open Patent Publication No. 2007-159364, and
[Document 3] Japanese Laid-open Patent Publication No. 2008-182884.

SUMMARY

According to an aspect of the invention, a control circuit includes: a first switching element having a source, a gate, and a drain; a battery configured to supply a voltage to the gate through a second switching element; a PWM signal generator circuit configured to supply a PWM signal to the gate through a third switching element; and a gate control circuit configured to, under a power-off condition, turn on the second switching element to supply the voltage of the battery to the gate and turns off the third switching element, and configured to under a power-on condition, turn on the third switching element to supply the PWM signal voltage to the gate and turns off the second switching element.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Description will be given with regard to a high electron mobility transistor (HEMT) using gallium nitride (GaN) as an example of a compound semiconductor. The transistor will be hereinafter called GaN-HEMT.

The GaN-HEMT is a three-terminal transistor having a drain, a source, and a gate. For example, when the source is grounded, a predetermined positive voltage is applied across the source and the drain, and a voltage applied across the source and the gate is set equal to or higher than a threshold value, the GaN-HEMT is brought into conduction (or is turned on) across the source and the drain. The threshold value of the voltage applied across the source and the gate lies between −10 and +10 V inclusive, for example. The GaN-HEMT may be treated as well as operate in the same manner as a metal oxide semiconductor field effect transistor (MOS-FET).

A typical silicon MOS-FET is of a normally-off type (or an enhancement type) which is turned off under a condition where no voltage is applied to the gate, whereas the GaN-HEMT is generally of a normally-on type (or a depletion type) which is turned on under a condition where no voltage is applied to the gate. Therefore, a negative regulator for reducing a gate voltage to a threshold value of a negative potential or lower is provided for switching of the GaN-HEMT.

It is known that the GaN-HEMT of the normally-on type, when brought into switching operation at high voltage, becomes electrically charged at an interface of a gate insulator immediately underneath the gate, thus increases in threshold voltage, and hence behaves like the normally-off type for the time being.

Figure 1A:
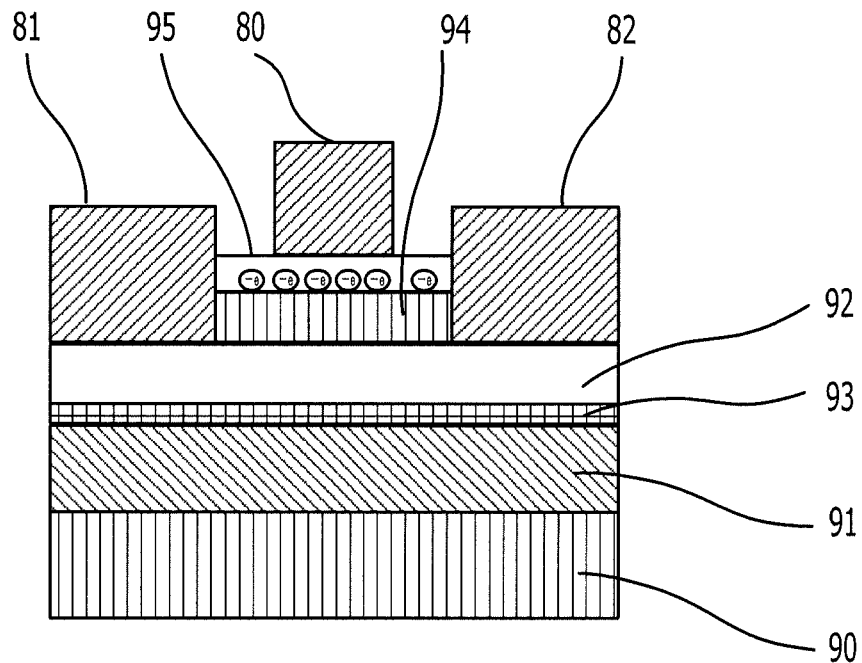
FIGS. 1A and 1B are a view and a graph, respectively, for explaining a GaN-HEMT.

FIG. 1A illustrates a cross section of the GaN-HEMT. In the GaN-HEMT, a GaN layer 91 and an aluminum gallium nitride (AlGaN) layer 92 are formed by crystal growth on top of a substrate 90 made of sapphire, silicon carbide (SiC), GaN, silicon (Si), or the like. In addition, a source 81 and a drain 82 are formed on top of the AlGaN layer 92 with an n-GaN layer 94 sandwiched in between the source 81 and the drain 82. A gate 80 is formed on top of the n-GaN layer 94 with a gate insulator 95 in between. In the GaN-HEMT, a two-dimensional electron gas layer 93 between the GaN layer 91 and the AlGaN layer 92 acts as an electron transit layer. When the GaN-HEMT is brought into switching operation at high voltage, the GaN-HEMT bears electrical charges accumulated at the interface of the gate insulator 95 immediately underneath the gate 80 as illustrated in FIG. 1A, so that the threshold voltage of the GaN-HEMT rises to a positive voltage.

Figure 1B:
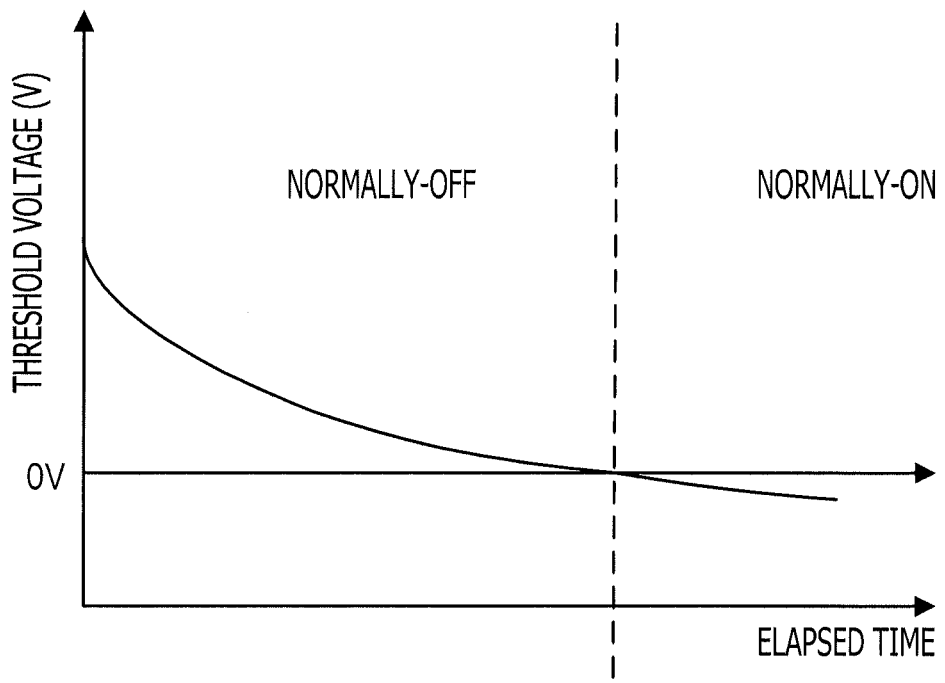

FIG. 1B represents a change in the threshold voltage of the GaN-HEMT as electrically charged immediately underneath the gate. Under a condition where the GaN-HEMT is brought into switching operation so as to become electrically charged to a certain degree at the interface of the gate insulator 95 immediately underneath the gate 80, the threshold voltage remains at positive voltage level even if the gate voltage is set at zero potential. When the gate is left at zero voltage for a long time (e.g. a few months to a year), the GaN-HEMT is gradually discharged underneath the gate and thus returns to normally-on type.

When the GaN-HEMT rendered normally-off is used as a switching element for a power supply of a device, the GaN-HEMT returns to the normally-on type if the device is left in a power-off state over a long period. Under this condition, switching is not performed unless a negative potential is applied to the gate of the GaN-HEMT. In addition, upon power-up, the GaN-HEMT may abruptly receive a high voltage and hence be broken down through a leakage current.

First, description will be given with regard to a procedure for rendering the normally-on type GaN-HEMT normally-off.

Figure 2A:
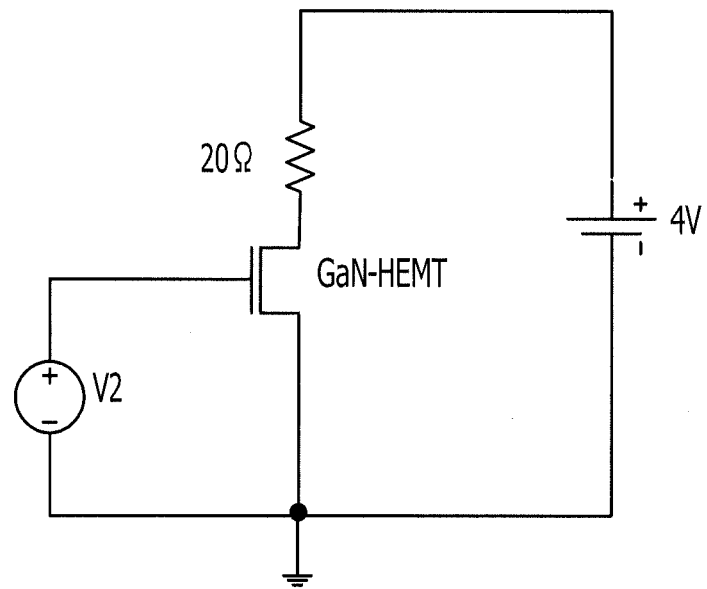
FIGS. 2A and 2B are a diagram and a plot, respectively, for explaining a procedure for rendering the GaN-HEMT normally-off.

FIG. 2A illustrates a circuit which serves both as a circuit for rendering the normally-on type GaN-HEMT normally-off and as a threshold voltage measurement circuit. A load power of 4 V and a load resistance of 20Ω are connected to the GaN-HEMT, and a voltage of −5 to +10 V and a triangular wave with a frequency of 1 kHz and a duty ratio of 50% are applied to the gate of the GaN-HEMT, thereby rendering the GaN-HEMT normally-off.

Figure 2B:
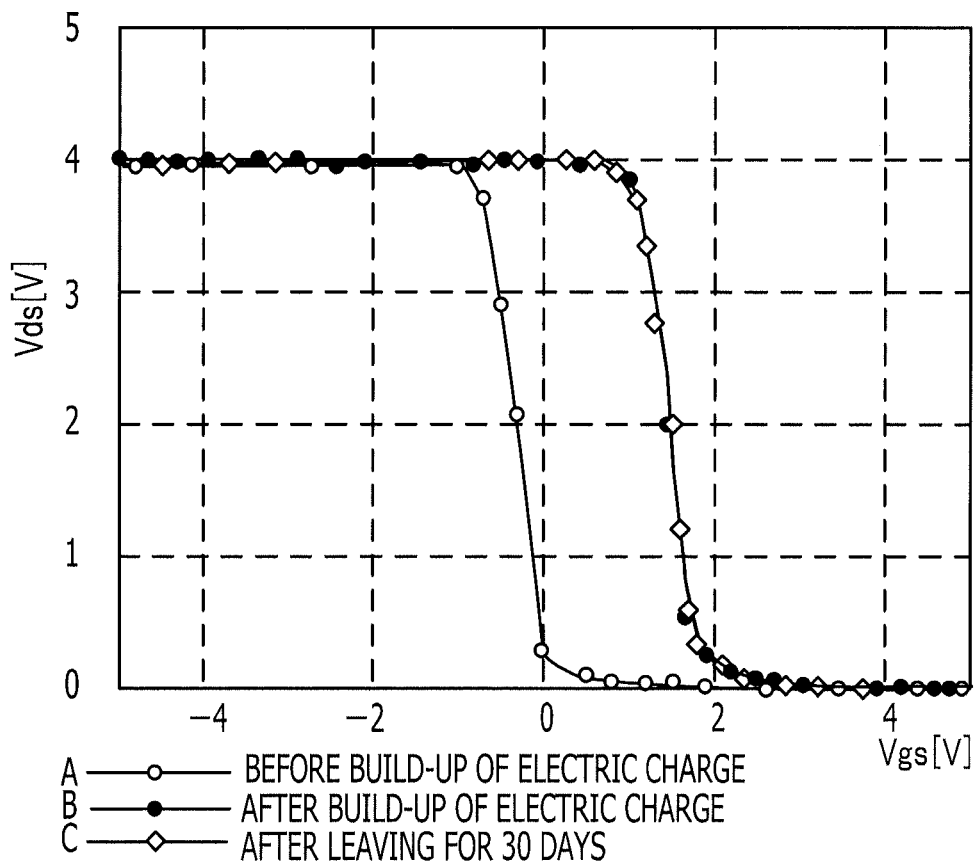

FIG. 2B illustrates a change in the threshold voltage of the GaN-HEMT. A line A in FIG. 2B indicates the threshold voltage of the GaN-HEMT before becoming electrically charged, or in an initial state. The threshold voltage is of the order of −1 V, which exhibits normally-on characteristics.

A line B in FIG. 2B indicates the threshold voltage of the GaN-HEMT after an hour of continuous application of a voltage of −5 to +10 V and the triangular wave with a frequency of 1 kHz and a duty ratio of 50% to the gate of the GaN-HEMT. The threshold voltage shifts to positive potentials, and the GaN-HEMT is rendered normally-off.

A GaN-HEMT element rendered normally-off is connected to a PFC circuit unit of a server power supply circuit so as to operate as a switching element. After the GaN-HEMT element has operated in the server power supply circuit for an hour by performing continuous switching under conditions as given below: a frequency of 100 kHz, a gate voltage of 0 to 10 V, varying duty ratios of 0% to 10%, and a source-drain voltage of 400 V. The threshold voltage characteristics become substantially equal to those indicated by the line B. Even application of high-voltage power loads causes no variations in the threshold voltage. From this, it may be seen that the GaN-HEMT element, at the time of being rendered normally-off, is fully electrically charged to saturation, and therefore, even application of higher loads causes no change in the threshold voltage.

Then, a line C in FIG. 2B indicates the threshold voltage characteristics of the GaN-HEMT rendered normally-off, after the GaN-HEMT has been left for a month with a voltage of +3 V applied across the gate and the source of the GaN-HEMT. The line C also becomes substantially equal to the line B. There is no drop in the threshold voltage, provided that the gate voltage is kept equal to or higher than the threshold voltage.

Embodiments discussed herein will be described in detail below with reference to the drawings.

Figure 3:
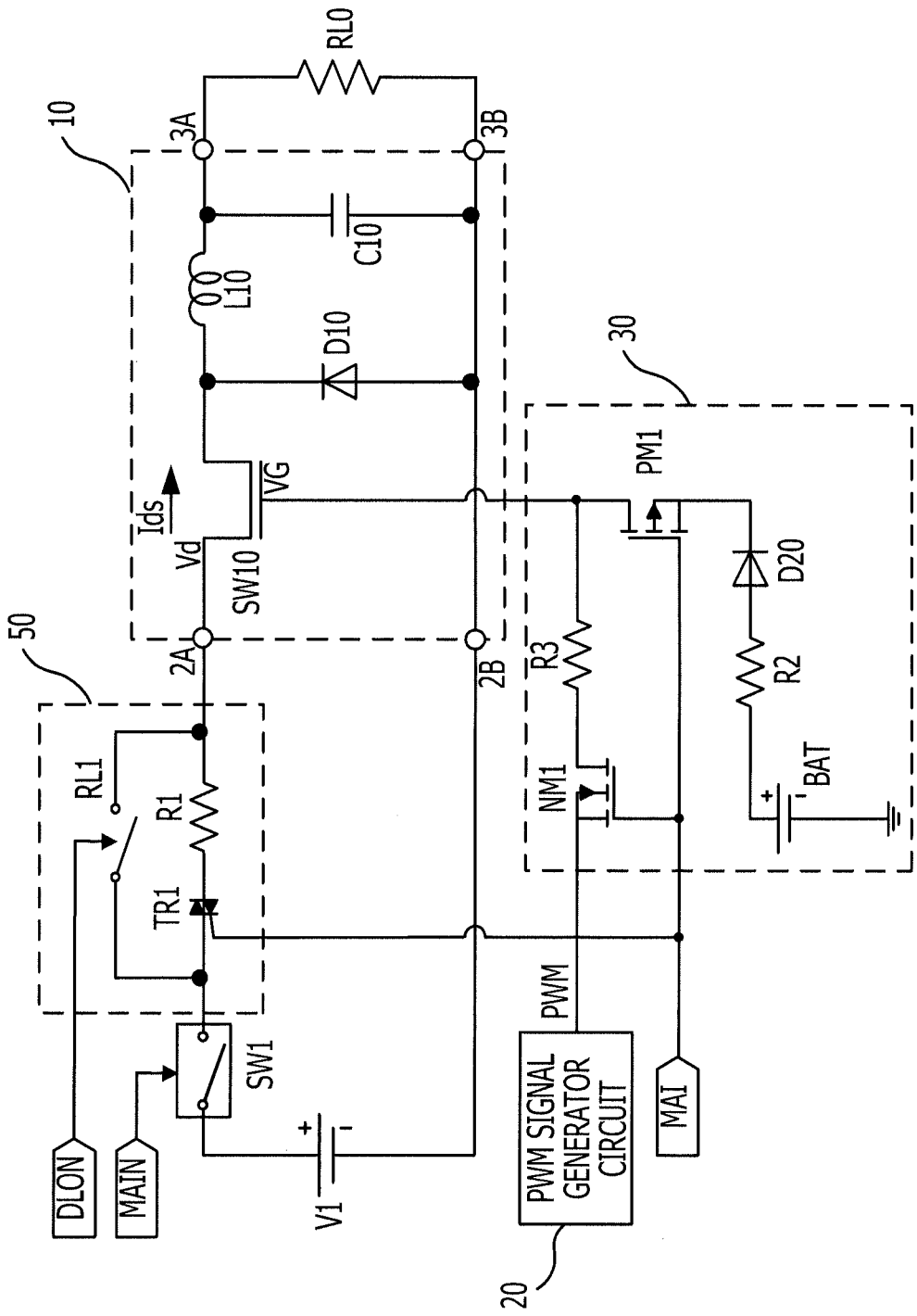
FIG. 3 is a circuit diagram of a step-down type converter of a first embodiment.

FIG. 3 is a circuit diagram illustrating an embodiment in which a GaN-HEMT rendered normally-off is applied to a step-down type converter of a power supply circuit. For example, a step-down type converter 10 illustrated in FIG. 3 converts a direct voltage V1 of 385 V into a direct voltage of 12 V, and outputs the converted direct voltage to a load circuit RL0.

The step-down type converter 10 includes a switching element SW10 which acts as a main switch to turn on and off the input voltage V1, a rectifier diode D10, an inductor coil L10, and a smoothing capacitor C10.

A PWM (Pulse Width Modulation) signal generator circuit 20 adjusts output voltage level of the step-down type converter 10 by a duty ratio of a PWM signal generated. The PWM signal generator circuit 20 operates at a direct voltage before a step-down, and monitors an output voltage to adjust the duty ratio of the PWM signal.

When the PWM signal generator circuit 20 applies a gate voltage in pulse form to a gate of the switching element SW10, the switching element SW10 performs on-off operation and is driven by PWM. The GaN-HEMT rendered normally-off by the above-described procedure is used as the switching element SW10.

Any diode may be used as the diode D10, provided that it has a direction of rectification from a negative electrode of the direct voltage source V1 to the inductor coil L10, and a fast recovery diode or a SiC Schottky diode, for example, is used.

A gate control circuit 30 has the function of supplying a voltage of a battery BAT to the gate of the switching element SW10 when a power control signal MAIN for on-off control of power is off, and supplying the PWM signal to the gate of the switching element SW10 when the power control signal MAIN is on.

An inrush current blocking circuit 50 is provided between the step-down type converter 10 and the direct voltage V1. The inrush current blocking circuit 50 includes a path having a triac TR1 and a limiting resistor R1 arranged in series, and a path of a relay RL1. The triac TR1 is a bidirectional thyristor, and is a three-terminal semiconductor rectifier element having characteristics as given below. It may be brought into conduction across an anode and a cathode by the passage of a gate current from the gate to the cathode, while it is brought out of conduction (or self-turnoff takes place) when the current across the anode and the cathode decreases to a certain value or less.

At the time when the power control signal MAIN becomes on, the triac TR1 is brought into conduction, and thereby, a current from the direct voltage V1 is fed through the drain of the switching element SW10 via the limiting resistor R1. The current is limited by the limiting resistor R1 so as to suppress a large current flowing rapidly into the drain of the switching element SW10 and the smoothing capacitor C10. Then, when the relay RL1 arranged in parallel with the triac TR1 and the limiting resistor R1 is turned on by a delay signal DLON that lags behind the power control signal MAIN, a current is fed through the drain of the switching element SW10 along the path of the relay RL1. There is a small amount of current passing through the path having the triac TR1 and the limiting resistor R1 arranged in series, and thus, self-turnoff occurs in the triac TR1, so that power losses in the triac TR1 and the limiting resistor R1 are reduced.

Figure 4:
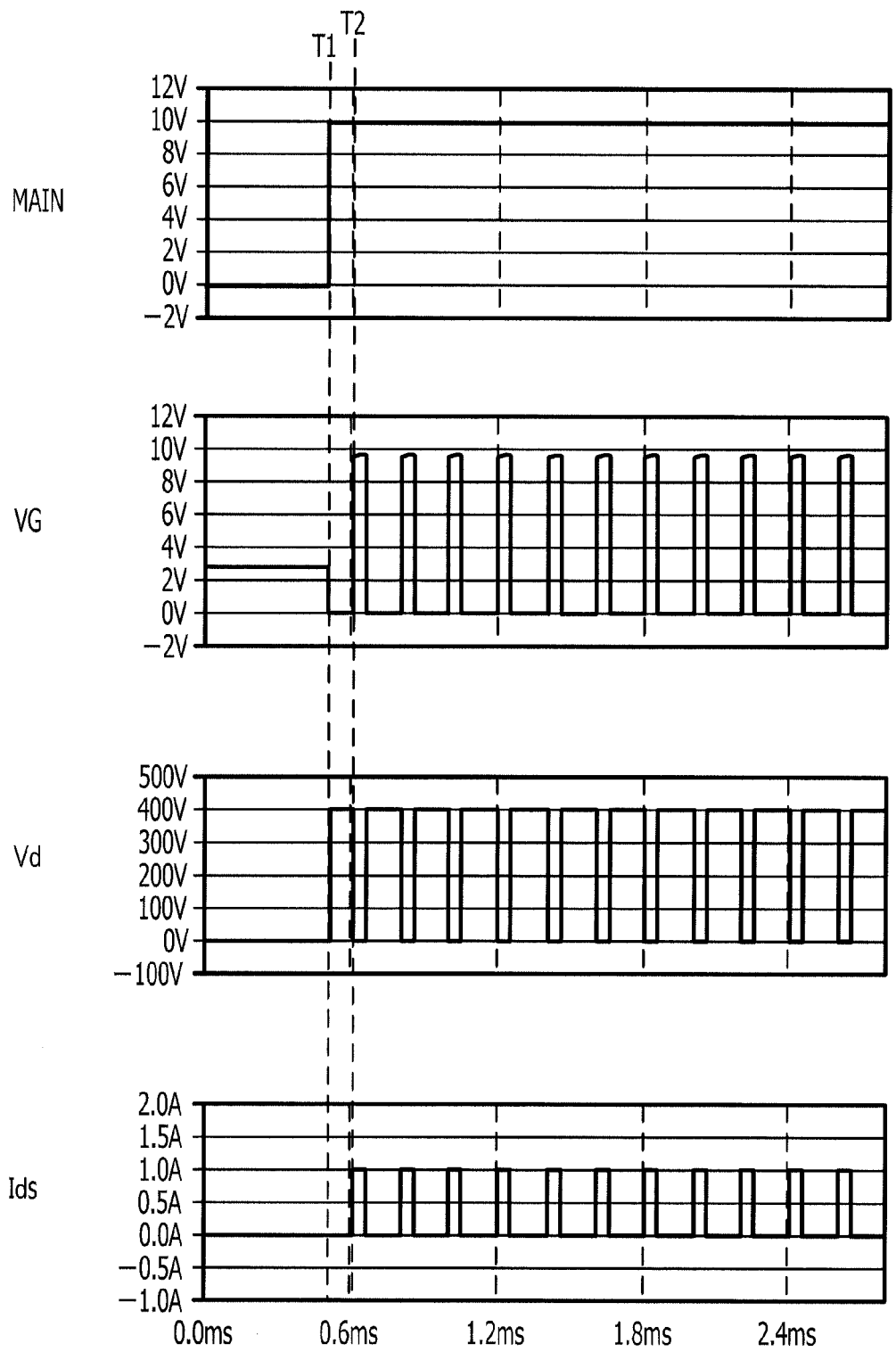
FIG. 4 is a chart for explaining operation of a gate control circuit of the first embodiment.

Next, description will be given with reference to FIG. 4 with regard to operation of the gate control circuit 30. FIG. 4 is a timing chart representing operation of the switching element SW10. In FIG. 4, a period between 0.0 ms and time T1 indicates a power-off condition, and the power control signal MAIN is off.

Referring to FIG. 3, during this period, a switching element NM1 connected at the drain side to the PWM signal generator circuit 20 is off so as to reduce the voltage of the battery BAT flowing back toward the PWM signal generator circuit 20 and causing a circuit breakdown or a malfunction. An n-channel type MOS-FET (NMOS-FET), for example, is used as the switching element NM1.

At the same time, a switching element PM1 connected at the drain side to the gate of the switching element SW10 is on so as to supply the voltage of the battery BAT to the gate of the switching element SW10 through a diode D20 and a resistor R2. A p-channel type MOS-FET (PMOS-FET), for example, is used as the switching element PM1, and the battery BAT has a voltage of 3 V for example, which is higher than the threshold voltage of the switching element SW10 rendered normally-off. At this time, a current flowing from the battery BAT is comparable to a leakage current of the gate of the switching element SW10, and thus, battery drain is minimized even if the battery is left for a long time.

Referring to FIG. 4, a gate voltage VG of the switching element SW10 is illustrated as being held at about 3 V. As described above, during the power-off condition, a voltage equal to or higher than the threshold voltage is supplied to the gate of the switching element SW10 rendered normally-off, and thus, the switching element SW10 is maintained to be normally-off.

Then, at the time T1, when the power is turned on and the power control signal MAIN is turned on, the switching element PM1 is turned off, the voltage of the battery BAT is not supplied to the gate of the switching element SW10, and the gate voltage VG of the switching element SW10 becomes temporarily zero. Since the switching element SW10 is rendered normally-off, the switching element SW10 remains off, and a drain-source current Ids is not fed through the switching element SW10. At the same time, the switching element NM1 is turned on, the PWM signal generator circuit 20 is electrically connected to the gate of the switching element SW10, and switching of the switching element SW10 becomes possible.

Then, at time T2, the PWM signal generator circuit 20 starts outputting a PWM signal to perform the switching of the switching element SW10. A direct voltage outputted to the load circuit RL0 is adjusted by changing the duty ratio of the PWM signal for on-off control of the gate of the switching element SW10.

Thereafter, if switching operation continues, the switching element SW10 continues maintaining its normally-off characteristics. In a power supply of an apparatus used under a power-on condition at all times, such as a server, the GaN-HEMT may be used remaining semipermanently normally-off.

Also, even for a period during which the power supply of the apparatus is off, such as a period during which the apparatus is transported from a factory to a customer, or a period during which the apparatus is maintained. The battery BAT keeps the gate voltage of the switching element SW10 equal to or higher than the threshold voltage, and thus, the normally-off characteristics of the GaN-HEMT are maintained.

According to the embodiment, the GaN-HEMT rendered normally-off may be continuously used in a normally-off state, and thus, a negative voltage generator circuit for the control of the normally-on GaN-HEMT is not provided.

Figure 5:
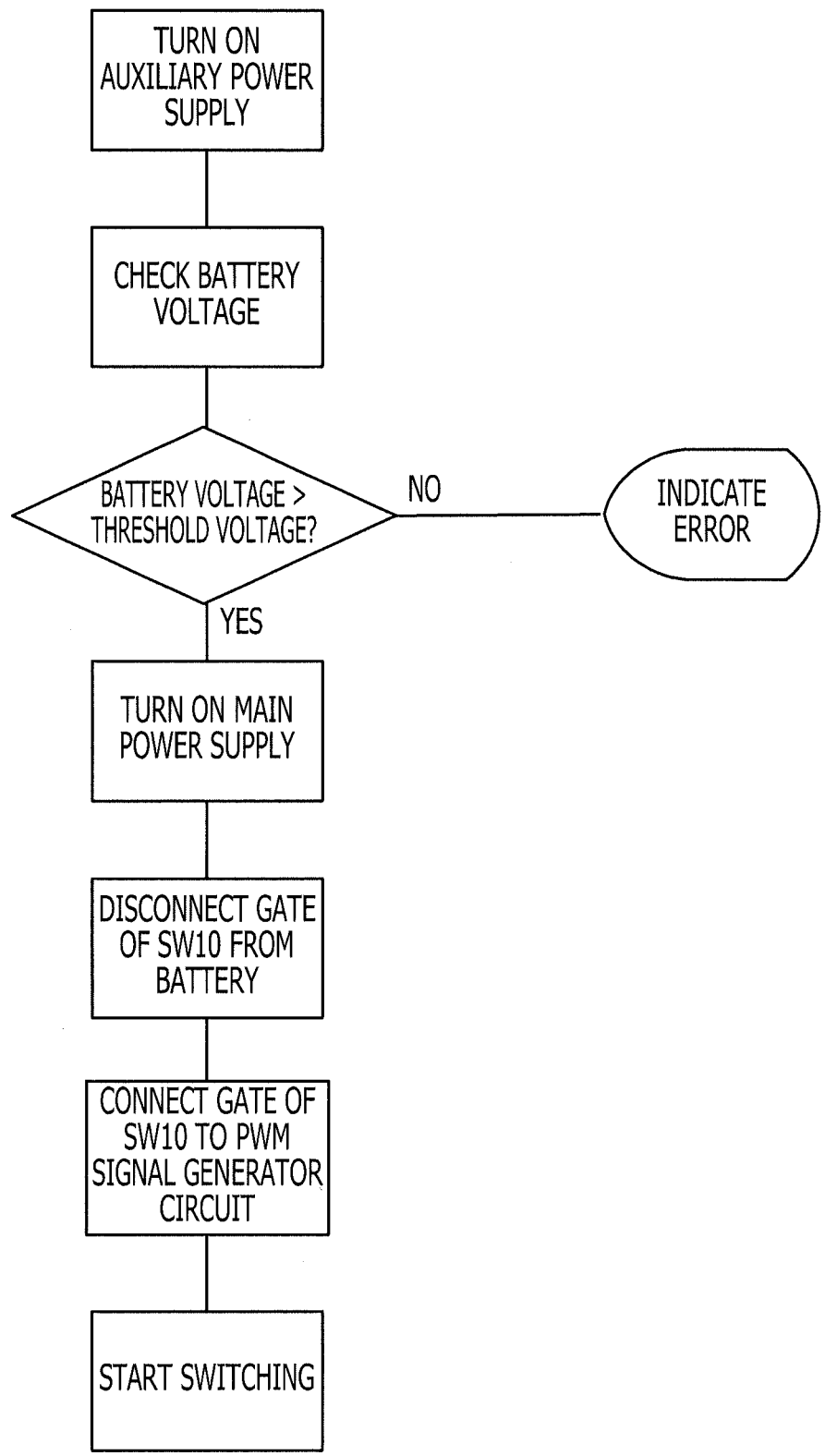
FIG. 5 is a flowchart for explaining a power-up control method.

Next, a power-up control method will be described with reference to FIG. 5. If the power supply of the apparatus is off over a long period, for example for a few months or more, battery drain occurs, and thus, the GaN-HEMT rendered normally-off may return to a normally-on state. As previously described, the application of a high voltage to the GaN-HEMT in the normally-on state may cause a breakdown through a leakage current. In order to suppress this, there is a method in which, before power-up of the apparatus, a comparator or the like checks that the voltage of the battery is higher than the threshold voltage of the GaN-HEMT rendered normally-off, and then, normal operation is started. In this method, a battery voltage detector circuit is provided around the step-down type converter 10 illustrated in FIG. 3.

First, before power-on of the step-down type converter 10, an auxiliary power supply for supplying power to the battery voltage detector circuit is turned on.

Then, the battery voltage detector circuit performs a comparison to check whether the voltage of the battery is equal to or higher than the threshold voltage of the GaN-HEMT rendered normally-off.

At this time, when the voltage of the battery is lower than the threshold voltage of the GaN-HEMT rendered normally-off, a decision is made that the GaN-HEMT has returned to the normally-on state, an error indication is provided on some display device or other, and processing is brought to an end.

When the voltage of the battery is higher than the threshold voltage of the GaN-HEMT rendered normally-off, a decision is made that the GaN-HEMT is maintained in the normally-off state, and a normal power-on process is started. In this processing, when the voltage of the battery is lower than a voltage capable of maintaining the normally-off state, a decision is made that the GaN-HEMT has returned to the normally-on state, and the processing is brought to an end. However, even if the voltage of the battery is lower than the threshold voltage of the GaN-HEMT rendered normally-off, the GaN-HEMT may remain in the normally-off state. In this case, a recovery process for increasing the threshold voltage may be performed to bring the GaN-HEMT into normal operation.

Figure 6:
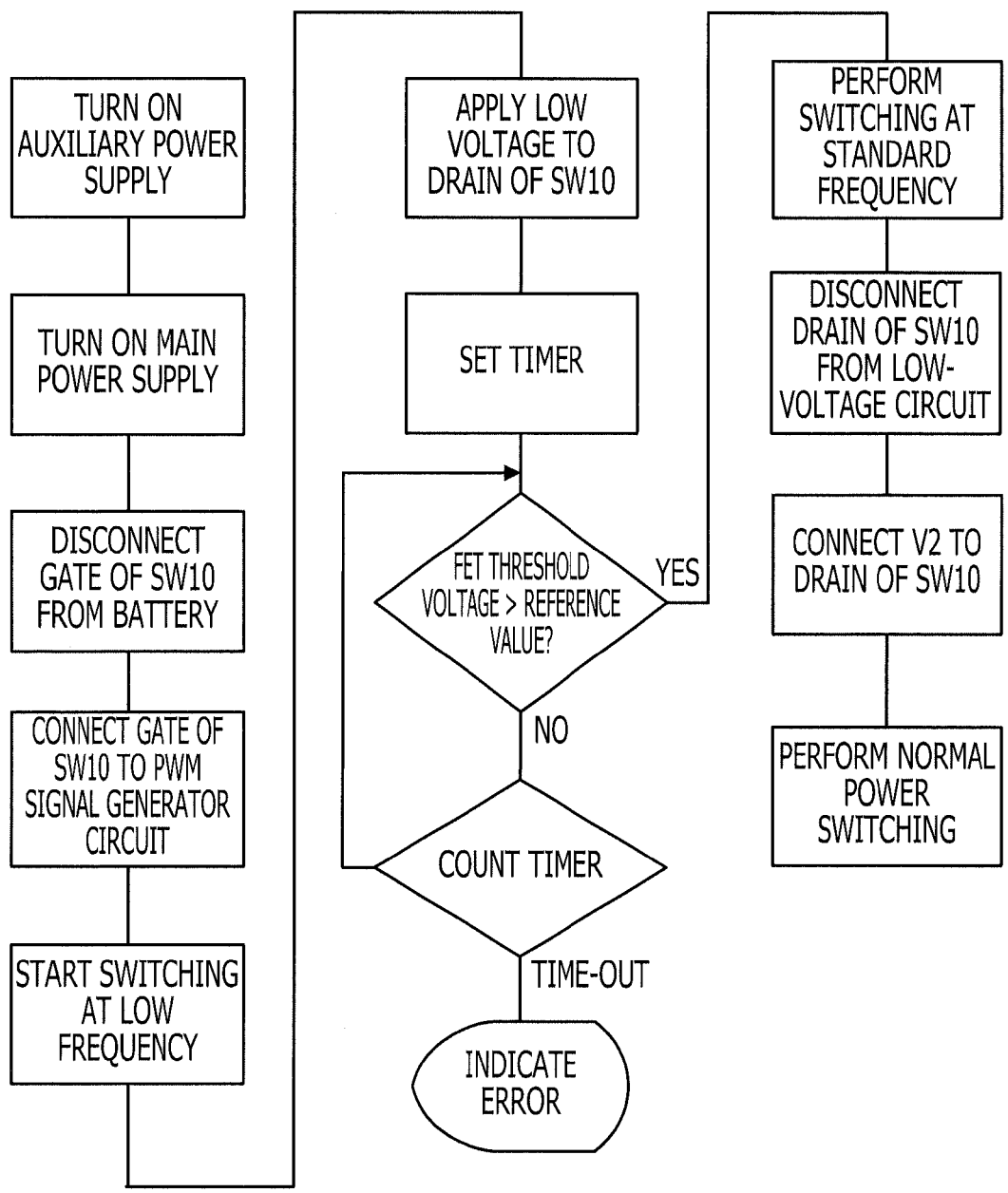
FIG. 6 is a flowchart for explaining a power-up control method including a recovery process.

Next, a power-up control method including the recovery process will be described with reference to FIG. 6. This control method uses a threshold voltage measurement circuit corresponding to the threshold voltage measurement circuit illustrated in FIG. 2A.

First, before power-on of the step-down type converter 10, an auxiliary power supply for supplying power to the threshold voltage measurement circuit is turned on, and then a main power supply is turned on. The supply of the voltage of the battery BAT to the gate of the switching element SW10 is interrupted, and then, the PWM signal generator circuit supplies a PWM signal having a frequency much lower than that of a PWM signal supplied under normal operating conditions, to the gate of the switching element SW10. A voltage much lower than a voltage supplied under normal operating conditions is supplied also to the drain of the switching element SW10, and switching is performed. At this time, even if the GaN-HEMT is in the normally-on state, the GaN-HEMT does not suffer a breakdown through a leakage current because the voltage applied to the drain is low.

Then, the threshold voltage of the GaN-HEMT is measured by using the threshold voltage measurement circuit. When the threshold voltage is high to a certain degree, e.g. about 1.2 V, a decision is made that normal operation is possible, and the threshold voltage measurement circuit is disconnected in order to bring the threshold voltage measurement to an end. Then, in order to perform the normal operation, the PWM signal generator circuit supplies a PWM signal having a frequency for the normal operation to the gate of the switching element SW10. A voltage for the normal operation is supplied also to the drain of the switching element SW10, and switching is performed.

When the threshold voltage is lower than 1.2 V, a PWM signal with a frequency much lower than that of a PWM signal for the normal operation is continuously supplied to the gate of the switching element SW10. In some cases, the threshold voltage may increase gradually. Timer supervision is performed, the threshold voltage measurement circuit performs measurement to determine whether the threshold voltage increases to 1.2 V, and, when the threshold voltage reaches 1.2 V, the processing goes to the normal operation.

When the threshold voltage does not reach 1.2 V even with the continuous supply of the PWM signal with a low frequency, a decision is made that recovery is not possible, an error indication is provided on some display device or other, and the processing is brought to an end.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A control circuit comprising:
   a first switching element having a source, a gate, and a drain;
   a second switching element configured to supply positive voltage of a battery to the gate under a power-off condition of the control circuit; and
   a third switching element configured to supply a pulse width modulation signal of a signal generator to the gate of under a power-on condition of the control circuit, the pulse width modulation signal is not supplied to the gate under the power-off condition of the control circuit.

2. The control circuit according to claim 1,
   wherein the first switching element is a GaN-HEMT rendered normally-off from a normally-off state.

3. The control circuit according to claim 2,
   wherein the voltage of the battery is higher than a threshold voltage of the GaN-HEMT rendered normally-off.

4. The control circuit according to claim 1,
   wherein a signal generator circuit outputs a first PWM signal having a first frequency, and a second PWM signal having a second frequency that is lower than the first frequency.

5. The control circuit according to claim 1,
   wherein the second switching element is a PMOS-FET, and the third switching element is an NMOS-FET.

6. The control circuit according to claim 1, further comprising:
   an inrush current blocking circuit on the drain side of the first switching element,
   wherein the inrush current blocking circuit includes a triac and a resistor connected in series, and a relay connected in parallel with the triac and the resistor.

7. An electronic device comprising:
   a converter circuit including:
      a first switching element having a source, a gate, and a drain;
      a second switching element configured to supply positive voltage of a battery to the gate under a power-off condition of the control circuit; and
      a third switching element configured to supply a pulse width modulation signal of a signal generator to the gate of under a power-on condition of the control circuit, the pulse width modulation signal is not supplied to the gate under the power-off condition of the control circuit.

* * * * *

UNITED STATES PATENT AND TRADEMARK OFFICE
CERTIFICATE OF CORRECTION

PATENT NO. : 8,698,547 B2  
APPLICATION NO. : 13/624122  
DATED : April 15, 2014  
INVENTOR(S) : Nakao Page 1 of 1

It is certified that error appears in the above-identified patent and that said Letters Patent is hereby corrected as shown below:

In the Claims

Column 8, Line 13, In Claim 4, after "generator" delete "circuit".

Signed and Sealed this
Twenty-second Day of July, 2014

Michelle K. Lee
*Deputy Director of the United States Patent and Trademark Office*